(12) United States Patent
Bula et al.

(10) Patent No.: US 6,258,490 B1
(45) Date of Patent: Jul. 10, 2001

(54) TRANSMISSION CONTROL MASK UTILIZED TO REDUCE FORESHORTENING EFFECTS

(75) Inventors: Orest Bula, Shelburne; Daniel C. Cole, Jericho; Edward W. Conrad, Jeffersonville; William C. Leipold, Enosburg Falls, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/350,863

(22) Filed: Jul. 9, 1999

(51) Int. Cl.⁷ ........................................... G03F 9/00
(52) U.S. Cl. ............................................... 430/5
(58) Field of Search ..................... 430/5, 311, 313, 430/318, 322, 323, 324

(56) References Cited

U.S. PATENT DOCUMENTS

| | | | |
|---|---|---|---|
| 4,704,342 | 11/1987 | Lehrer et al. | 430/5 |
| 4,902,899 | 2/1990 | Lin et al. | 250/492 |
| 5,126,006 | 6/1992 | Cronin et al. | 156/643 |
| 5,324,600 | 6/1994 | Jimbo et al. | 430/5 |
| 5,478,678 | 12/1995 | Yang et al. | 430/5 |
| 5,636,002 | 6/1997 | Garofalo | 430/5 |
| 5,716,738 | 2/1998 | Garza | 430/5 |
| 5,725,972 | 3/1998 | Takeshita | 430/5 |
| 5,725,973 | 3/1998 | Han et al. | 430/5 |
| 5,783,336 | 7/1998 | Aoki et al. | 430/5 |
| 5,786,114 | 7/1998 | Hashimoto | 430/5 |
| 5,789,116 | * 8/1998 | Kim | 430/5 |
| 5,827,623 | 10/1998 | Ishida et al. | 430/5 |
| 5,863,712 | 1/1999 | Von Bunau et al. | 430/396 |
| 5,914,202 | * 6/1999 | Nguyen et al. | 430/5 |

* cited by examiner

*Primary Examiner*—Mark F. Huff
*Assistant Examiner*—Saleha R. Mohamedulla
(74) *Attorney, Agent, or Firm*—Scully, Scott, Murphy & Presser; William D. Sabo, Esq.

(57) ABSTRACT

A transmission controlled mask (TCM) for providing effective and accurate printing of images on a semiconductor wafer is defined. The transmission controlled mask (TCM) of the present invention includes opaque regions, clear regions, and transmission controlled (TC) regions, each region have different transmittance for reducing and/or eliminating the foreshortening which occurs in image printing. By employing the TCM of the present invention and adjusting the exposure time, images of lines and holes may be printed correctly with the same mask. The TCM of the present invention comprises a quartz substrate having a carbon layer and a chrome layer deposited on its surface.

15 Claims, 4 Drawing Sheets

TRANSMISSION CONTROL MASK UTILIZED TO REDUCE FORESHORTENING EFFECTS

DESCRIPTION

1. Field of the Invention

The present invention generally relates to semiconductor fabrication technology and more particularly to a photomask used in the production of semiconductor devices.

2. Background of the Invention

The photolithography process generally involves exposing light through a photomask onto a photoresist coating on a wafer. The photomask typically includes a transparent portion and an opaque portion, thereby forming a pattern and selectively exposing the photoresist coating to the light according to the pattern. Photoresist coatings are produced from organic solutions which, when exposed to light of the proper wavelength, are chemically changed in their solubility to certain solvents (developer). For example negative-acting resist is initially a mixture which is soluble but after light exposure becomes polymerized and insoluble. Thus, when the light is exposed through a photomask having a pattern formed by its transparent and opaque portions onto the photoresist, the unexposed resist selectively dissolves, softens, or washes away, leaving the desired pattern on the underlying wafer. Positive-acting resists work in the opposite fashion, i.e., exposure to light makes the polymer mixture soluble in the developer. Thus, in positive-acting resists, the transparent portions of the mask correspond to the desired pattern or image to be provided in the resist coating. The remaining pattern then is treated through the rest of the fabrication process for forming a desired semiconductor device.

As the number of circuits printed on a semiconductor chip increases, the pattern features must become smaller, mandating a high degree of accuracy in transferring the correct pattern into the photoresist. However, as the linewidth of the features which are printed on semiconductor wafers decreases, a phenomenon referred to as "foreshortening" (line end shortening) occurs. Foreshortening is the behavior typically observed in near or subresolution lithography whereby a photoresist line prints shorter than the corresponding line design on the photomask when forcing the width of the printed line to be correctly reproduced.

FIG. 1 shows a photomask 102 with a chrome or opaque region 106 and a clear region 104, whose mask image is printed on positive resist 108. In FIG. 1, the cross hatching 106 represents chrome or opaque regions, and 112 represents photoresist. The exposure, baking, and resist dissolution process steps are adjusted in conformance to a known technique to ensure that the width of the line prints according to the desired width. As illustrated by the image printed on the resist 108 in FIG. 1, "foreshortening" typically occurs, so that the printed length of the line is shorter than the design dimension, even though the printed width dimension matches the width design dimension.

One known method employed to recover from such shortening of the printed length is to place serif shapes called "anchors" at the ends of the rectangular lines on a photomask. This technique of eliminating foreshortening is shown in FIG. 2A. The anchors 204a are the serifs projecting from the sides of the mask rectangular shape, turning the long rectangular line into a rectangular line with serifs, making the line into a capital "I" shape. Anchors 204a are an effective technique for eliminating or reducing foreshortening as can be seen in the pattern 210 formed on the resist.

However, there are several drawbacks associated with this technique. First, this technique increases the data volume in the mask image data sets. Second, and perhaps more importantly, as the space between shapes decreases, it is difficult to add the anchors. For example, as shown in FIG. 2B, due to the limited space between the shapes, the anchors 204a need to be spaced closely to each other, worsening another known problem in photolithography, i.e., the proximity effect. Briefly, the proximity effect is due to diffraction of light incident on the photomask, producing an undesirable distortion of the image pattern. Therefore, it is highly desirable to have a mask which reduces the "foreshortening" effect on the image patterns without increasing the undesired proximity effect.

Further, with a typical conventional mask with clear image patterns of lines and holes, the lines get foreshortened and the holes do not print at all when the process is adjusted to correctly print the width of the lines. Such an example is shown in FIG. 4. As illustrated, the clear image region 404 on the mask 402 is foreshortened when printed as an image 410 on a positive resist 408. Moreover, a clear hole 414 pattern on the mask 402 is not printed on the positive resist 408. Therefore, it is also highly desirable to enable pattern formations of lines and holes present on the same mask.

SUMMARY OF THE INVENTION

The present invention is directed to a transmission controlled mask (TCM) for providing effective and accurate printing of images. Moreover, the transmission controlled mask provides the ability to accurately print a line and a hole from the same mask. The transmission controlled mask (TCM) of the present invention includes opaque regions, clear regions, and transmission controlled (TC) regions, each region have different transmittance. The opaque regions block nearly 100% of light incident on it. The clear regions generally allow nearly all light to pass through: that is, the clear regions have nearly 100% transmittance. The transmission controlled (TC) regions of the TCM according to the present invention have a transmittance between those of the clear and opaque regions, for example, generally between 5% and 95%, with 85% transmittance preferred for clear images exposed onto positive resists.

The patterns on the mask include clear regions, transmission control regions, and opaque regions. For example, a line may be formed by having the transmission controlled region as the center and the clear regions as the two opposite ends. Modeling may be performed to modulate and determine different sizes and placements of the transmission control regions in an image pattern of the mask.

Moreover, in the present invention, small holes may also be printed along with the lines from the same mask by including a line comprising transmission control regions and clear contact holes. The intensity of light which a conventional rectangular region would receive is then decreased and the exposure time increased. Such a method results in the printing of both the line and the hole.

Further features and advantages of the present invention as well as the structure and operation of various embodiments of the present invention are described in detail below with reference to the accompanying drawings. In the drawings, like reference numbers indicate identical or functionally similar elements.

BRIEF DESCRIPTION OF THE DRAWINGS

Preferred embodiments of the present invention will now be described, by way of example only, with reference to the accompanying drawings in which.

DETAILED DESCRIPTION OF THE PREFERRED EMBODIMENT OF THE INVENTION

The present invention is directed to a transmission controlled mask (TCM) for providing effective and accurate printing of images. The transmission controlled mask (TCM) of the present invention includes opaque regions, clear regions, and transmission controlled (TC) regions, each region have different transmittance. The opaque regions block nearly 100% of light incident on them. The clear regions of the present invention generally allow nearly all light to pass through them: that is, the clear regions have nearly 100% transmittance. The transmission controlled (TC) regions of the TCM according to the present invention have a transmittance between those of the clear and opaque regions, for example, generally between 5% and 95%. In the preferred embodiment of the present invention, the transmission control region (TC) is chosen to have 85% transmittance for clear images exposed onto positive resists.

Figure 1:
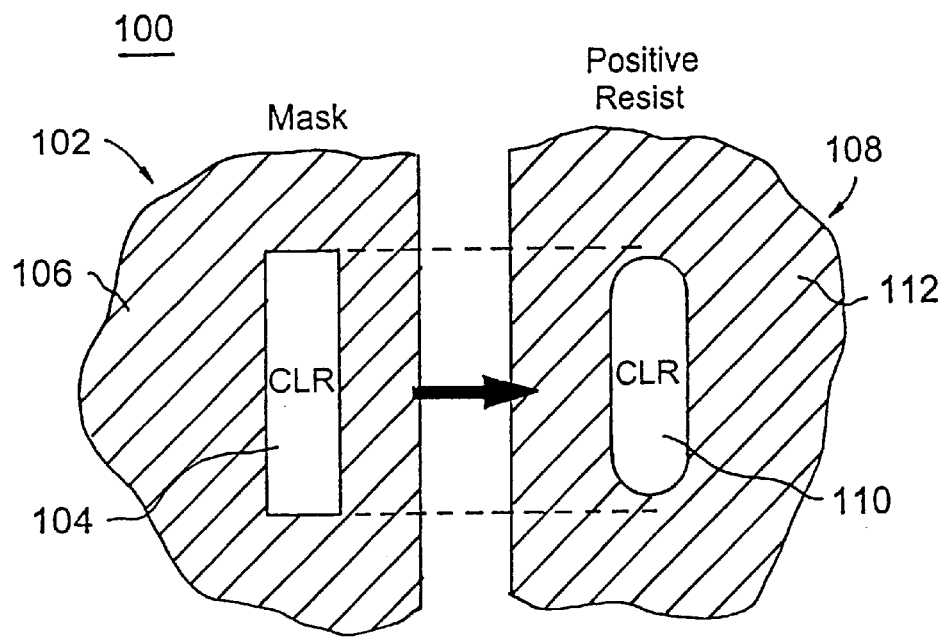
FIG. 1 illustrates a foreshortening effect resulting from a conventional mask with a clear line image.
Figure 2A:
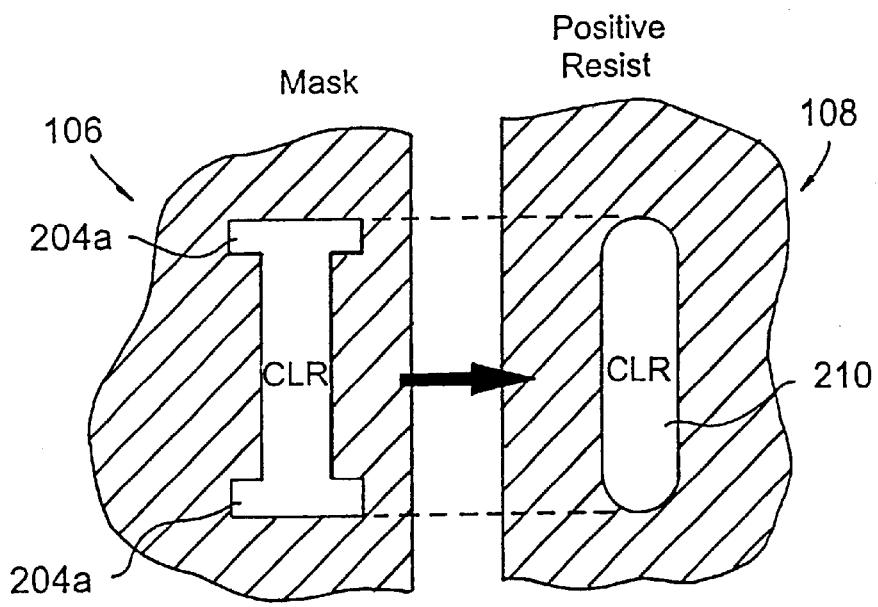
FIG. 2A shows a conventional mask having a clear line with serif formations for reducing the foreshortening which occurs on printed images.
Figure 2B:
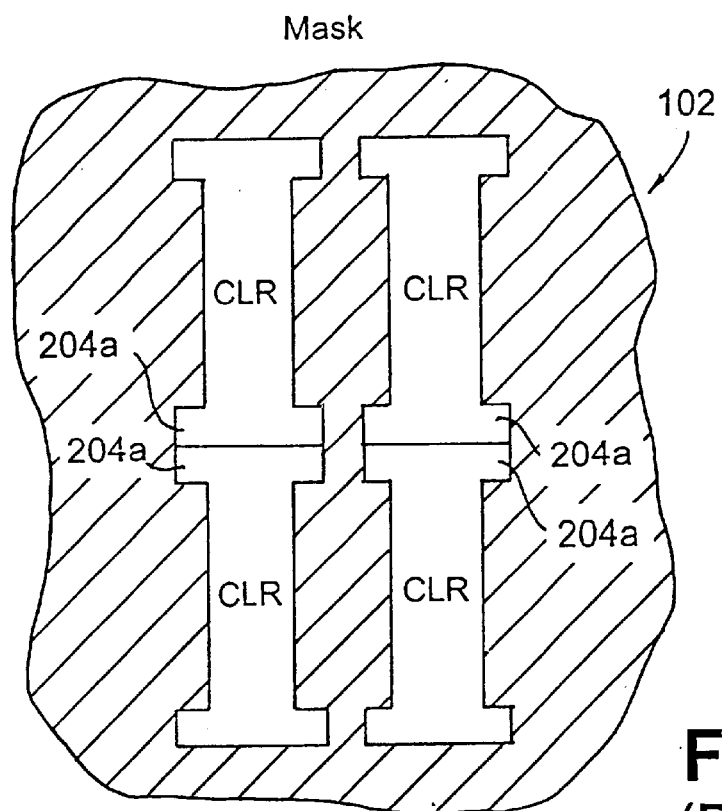
FIG. 2B shows a conventional mask having multiple lines with serif formations which result in spacing and proximity effect problems.
Figure 3:
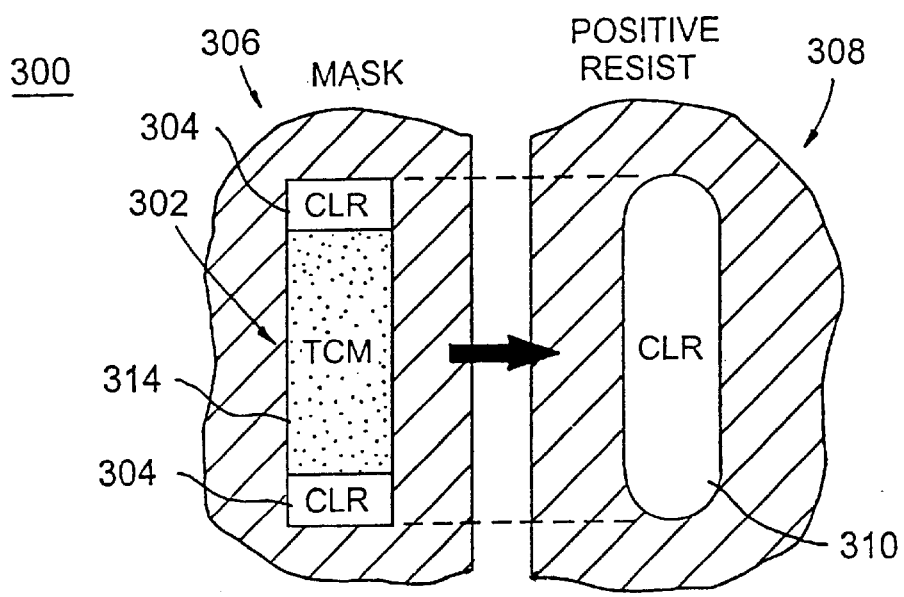
FIG. 3 shows the transmission controlled mask of the present invention and the images formed in a resist by employing the mask.
Figure 4:
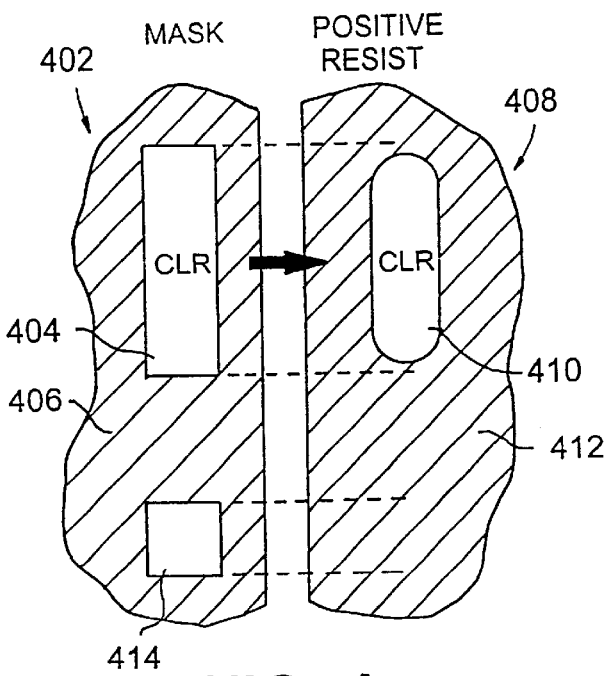
FIG. 4 shows a clear line image on a mask which is foreshortened when printed in a resist, and a clear hole on the same mask which does not print.

FIG. 3 shows a clear image 302 printed in positive resist 308 using a TCM image of the present invention. As shown, in the preferred embodiment of the present invention, the two opposite end portions 304 of the image 302 comprise the clear regions. The center region comprises a transmission control region 314, which is shown in the Figure filled with dots. Also as shown in FIG. 3, it can be seen that such a structure enables the correct length and width of the image 310 printed in the photo resist 308. Modeling may be performed to determine the exact size and placement of the TC region 314.

Figure 5:
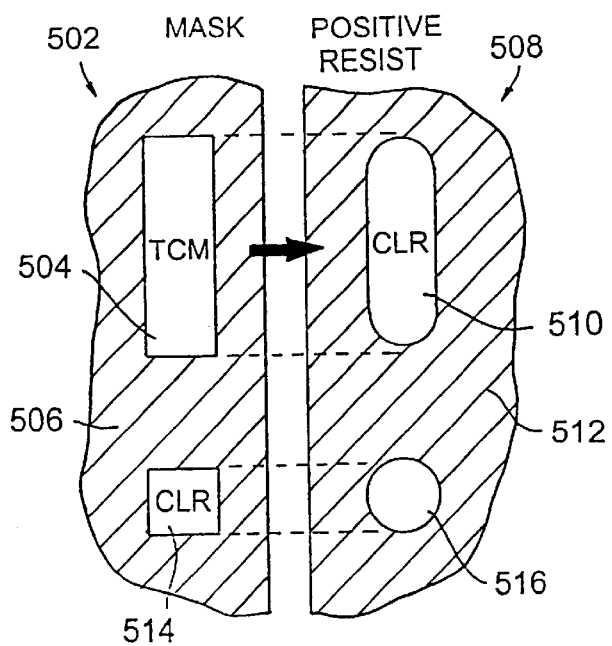
FIG. 5 shows a line image on a mask including the transmission control region of the present invention and a small hole on the same mask and the resulting printed images in the resist.

The TCM of the present invention also enables printing lines and holes on the same mask. For example, when the TCM of the present invention is employed for line patterns, a clear hole image on the same mask can also be printed correctly. Such combinations of lines and holes are enabled in the present invention by decreasing the intensity of light that the rectangular region receives, and requiring a longer exposure time to result in the structure printing. The longer exposure time enables the hole to print. Moreover, by adjusting the TCM transmittance, it is possible to tune the two structures to print simultaneously according to the desired design. FIG. 5 illustrates the TCM mask 502 with a TCM line pattern and a clear hole pattern. Although both the line and the hole print with the desired width, the line is seen as foreshortened. The foreshortening in this case may be reduced or eliminated further by having shorter TCM regions. In another embodiment, serifs may be added along with the TCM regions to increase the design capabilities.

Figure 6:
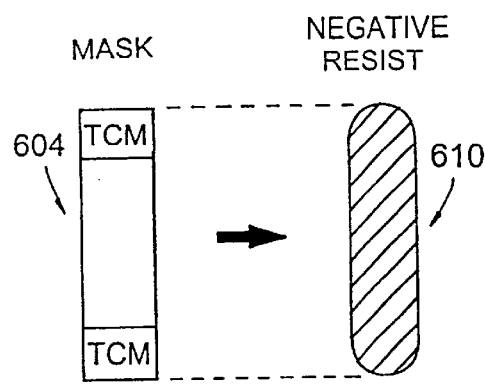
FIG. 6 shows the invention applied to a negative resist.

FIG. 6 shows the present invention when applied to a negative resist. As described above, the unexposed negative resist selectively dissolves leaving the desired pattern on the underlying wafer. The cross-hatched portion 610 of the negative resist illustrated in FIG. 6 represents the desired pattern.

Figure 7A:
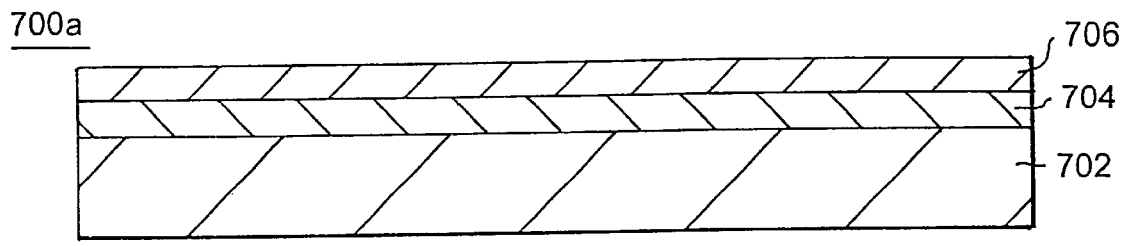
FIGS. 7A–7D show a preferred method of making a transmission controlled mask of the present invention.
Figure 7B:
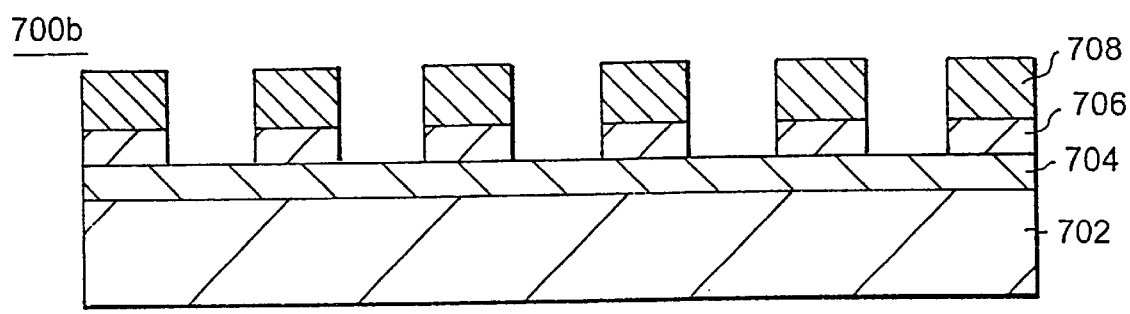
Figure 7C:
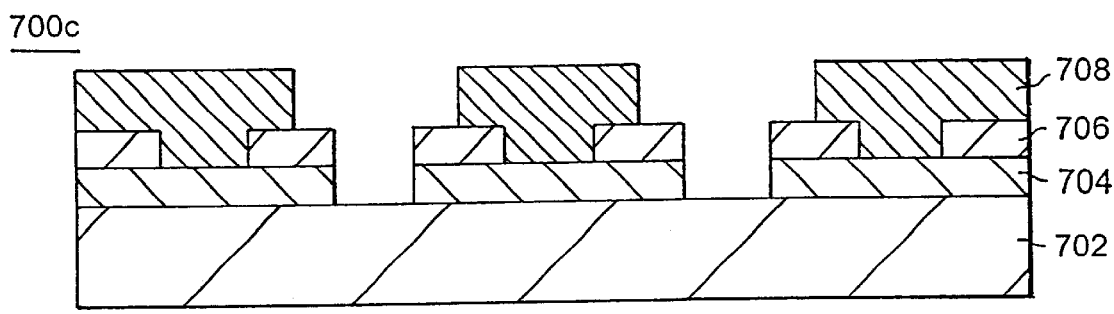
Figure 7D:
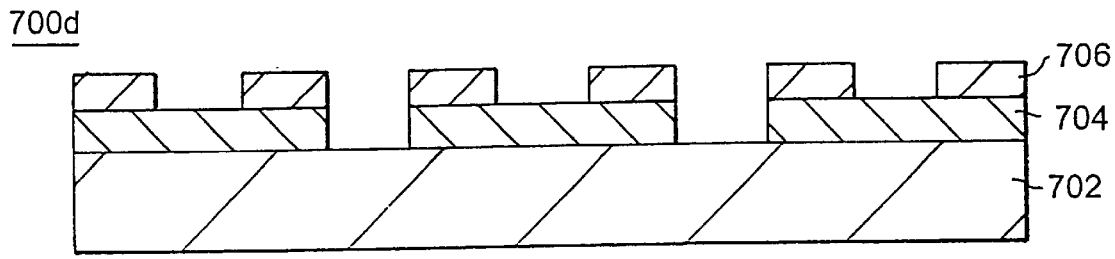

In the preferred embodiment, a TCM is a quartz substrate having a first carbon layer and a second chrome layer deposited on its surface as illustrated in FIGS. 7A to 7D. FIG. 7A, for example, illustrates a quartz substrate 702, a carbon layer 704, and a chrome layer 706. FIG. 7B illustrates the TCM of FIG. 7A with the substrate 700b having photoresist coating 708. In FIG. 7B, the photoresist 708 has been patterned and the chrome layer 706 etched where all clear and TC images are to be formed. The first layer of resist 708 is removed and a second layer applied and patterned. Alternatively, the first layer of resist 708 may be left in place and the second applied over it, reducing resist pinhole induced defects in the carbon film. Areas that are to be clear are exposed. The carbon is removed from these areas as illustrated in FIG. 7C. The mask having the quartz substrate and the first and second layers is shown in FIG. 7D. The clear images are quartz 702, the TC images are carbon 704 where the overlying chrome has been removed, and the opaque regions are chrome 706 over carbon 704.

In the preferred embodiment, the transmittance of the TC regions can be controlled by adjusting the carbon thickness. In another embodiment, the transmittance of the TC regions can be controlled by chemically treating the exposed carbon areas. In yet another embodiment, the transmittance of the TC regions can be controlled by both adjusting the carbon thickness and chemical treatment of the exposed carbon areas.

While the invention has been particularly shown and described with respect to a preferred embodiment thereof, it will be understood by those skilled in the art that the foregoing and other changes in form and details may be made therein without departing from the spirit and scope of the invention.

Having thus described our invention, what we claim as new, and desire to secure by letters patent is:

1. A photo mask for forming patterns on a semiconductor wafer coated with photo resist which is chemically reactive to a selected wavelength of light, the mask comprising:

a substrate having a clear surface, the clear surface having a first transmittance at the selected wavelength of light;

an opaque region on the surface of the substrate, the opaque region having a second transmittance at the selected wavelength of light; and a transmission control region on the surface of the substrate, the transmission control region having a third transmittance in between said first transmittance and said second transmittance at the selected wavelength of light, portions of the clear surface, the opaque region, and the transmission control region forming an image pattern on the substrate, wherein said photo mask permits increased dosage of light incident thereon to result in reduced foreshortening phenomena of a photoresist image pattern formed on said semiconductor wafer.

2. The photo mask as claimed in claim 1, wherein the image pattern formed on the substrate comprises two ends and a center portion, the ends including said clear surface having said first transmittance and the center portion including the transmission control region having said third transmittance at the selected wavelength of light, said photo mask being used for forming patterns on a semiconductor wafer coated with a positive photo resist.

3. The photo mask as claimed in claim 1, wherein the first transmittance includes transmittance of 95% to 100% of light at the selected wavelength.

4. The photo mask as claimed in claim 1, wherein the second transmittance includes transmittance of 0% to 5% of light at the selected wavelength.

5. The photo mask as claimed in claim 1, wherein the third transmittance includes transmittance of 5% to 95% of light at the selected wavelength.

6. The photo mask as claimed in claim 1, wherein the image pattern on the substrate includes an elongated shape having ends and a centers the ends comprising the portions of the substrate and the center comprising the transmission control region.

7. The photo mask as claimed in claim 1, wherein the image pattern on the substrate includes serif formations adjacent to the image pattern.

8. The photo mask as claimed in claim 1, wherein the substrate comprises a quartz substrate.

9. The photo mask as claimed in claim 8, wherein the transmission control region comprises a carbon layer deposited on the substrate.

10. The photo mask as claimed in claim 9, wherein the opaque region comprises a chrome layer deposited on the transmission control region.

11. A method of producing a transmission control mask for fabricating images on a semiconductor wafer, the method comprising:

defining a mask image pattern to include a clear region, a transmission control region, and an opaque region;

depositing a first carbon layer on a surface of a quartz substrate;

depositing a second chrome layer over the first carbon layer; and etching portions of the second chrome layer which form the transmission control region and the clear region of the defined image pattern, the first carbon layer being deposited to a thickness for allowing selected light transmission for the transmission control region of the defined image pattern, wherein said photo mask permits increased dosage of light incident thereon to result in reduced foreshortening phenomena of a photoresist image pattern formed on said semiconductor wafer.

12. The method as claimed in claim 11, wherein the method further includes:

chemically treating exposed areas of the first carbon layer to allow selected light transmission for the transmission control region of the defined image pattern.

13. The method as claimed in claim 11, wherein the method further includes coating the second chrome layer with a resist having a selected pattern prior to the step of etching.

14. The method as claimed in claim 13, wherein the method further includes removing the resist after the step of etching.

15. The method as claimed in claim 11, wherein the step of defining a mask image pattern further includes defining both line and hole patterns comprising clear regions.

\* \* \* \* \*